United States Patent
Liu

(10) Patent No.: US 11,355,596 B2
(45) Date of Patent: Jun. 7, 2022

(54) HIGH POWER DEVICE WITH SELF-ALIGNED FIELD PLATE

(71) Applicant: Taiwan Semiconductor Manufacturing Co., Ltd., Hsin-Chu (TW)

(72) Inventor: Ming Chyi Liu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/004,365

(22) Filed: Aug. 27, 2020

(65) Prior Publication Data

US 2021/0184005 A1  Jun. 17, 2021

Related U.S. Application Data

(60) Provisional application No. 62/948,922, filed on Dec. 17, 2019.

(51) Int. Cl.
| | |
|---|---|
| *H01L 29/40* | (2006.01) |
| *H01L 21/768* | (2006.01) |
| *H01L 29/66* | (2006.01) |
| *H01L 29/78* | (2006.01) |

(52) U.S. Cl.
CPC ...... *H01L 29/402* (2013.01); *H01L 21/76802* (2013.01); *H01L 29/66681* (2013.01); *H01L 29/7823* (2013.01)

(58) Field of Classification Search
None
See application file for complete search history.

(56) References Cited

U.S. PATENT DOCUMENTS

| | | | |
|---|---|---|---|
| 2008/0014690 A1* | 1/2008 | Chu | H01L 29/7846 438/197 |
| 2012/0228704 A1* | 9/2012 | Ju | H01L 29/402 257/339 |
| 2015/0123199 A1* | 5/2015 | Chen | H01L 29/66681 257/339 |

(Continued)

FOREIGN PATENT DOCUMENTS

TW  201511266 A  3/2015

OTHER PUBLICATIONS

Palankovski et al. "Field-Plate Optimization of AlGaN/Gan HEMTs." 2006 IEEE Compound Semiconductor Integrated Circuit Symposium. Published on Feb. 26, 2007.

(Continued)

*Primary Examiner* — Khaja Ahmad
(74) *Attorney, Agent, or Firm* — Eschweiler & Potashnik, LLC

(57) ABSTRACT

In some embodiments, the present disclosure relates to an integrated chip that includes a gate dielectric, a gate electrode, a field plate dielectric layer, and a field plate. The gate dielectric layer is arranged over a substrate and between a source region and a drain region. The gate electrode is arranged over the gate dielectric layer. The field plate dielectric layer is arranged over the substrate and between the gate dielectric layer and the drain region. The field plate is arranged over the field plate dielectric layer and is spaced apart from the gate dielectric layer.

20 Claims, 10 Drawing Sheets

(56) References Cited

U.S. PATENT DOCUMENTS

2015/0236150 A1* 8/2015 Chen .................... H01L 21/761
                                                327/109
2017/0263717 A1* 9/2017 Lin ..................... H01L 29/1095
2017/0278963 A1  9/2017 Liu et al.
2019/0288112 A1* 9/2019 Wang ................. H01L 29/7816

OTHER PUBLICATIONS

Cheung, N. "Electrical Characteristics of MOS Devices." U.C. Berkeley, published in 2010.
Draxler et al. "High Efficiency Envelope Tracking LDMOS Power Amplifier for W-CDMA." IEEE MTT-S International Microwave Symposium, Jul. 2006, published on Nov. 20, 2006.
Pritiskutch et al. "Understanding LDMOS Device Fundamentals." ST Microelectronics, published Jul. 2000.
Vacca, Giuseppe. "GaN-Based HEMT Improvement Using Advanced Structures." Semiconductor Today, vol. 7, Issue 7, published Sep. 2013.
Wikipedia.org. "Envelope Tracking." Published on Sep. 19, 2019.
Wikipedia.org "LDMOS." Published on May 9, 2020.

* cited by examiner

HIGH POWER DEVICE WITH SELF-ALIGNED FIELD PLATE

REFERENCE TO RELATED APPLICATION

This Application claims the benefit of U.S. Provisional Application No. 62/948,922, filed on Dec. 17, 2019, the contents of which are hereby incorporated by reference in their entirety.

BACKGROUND

Power metal-oxide-semiconductor field-effect transistors (MOSFETs) are MOSFETs designed to handle significant power levels, such as high voltages and/or high currents. Power MOSFETs find application in display drivers, power converters, motor controllers, vehicle power devices, and so on. One type of power MOSFET is a laterally-diffused metal-oxide semiconductor (LDMOS) transistor. LDMOS transistors have high gain, high power output, and high efficiency at high frequencies, such that LDMOS transistors are commonly used with microwave and radio frequency (RF) power amplifiers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
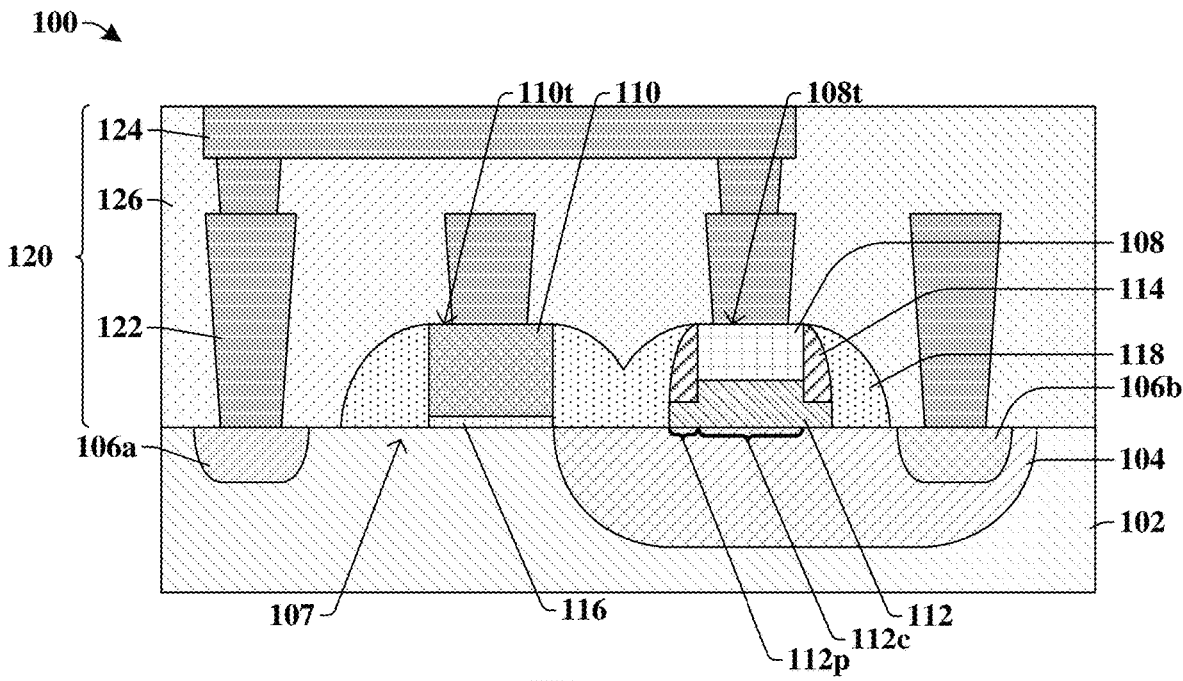
FIG. 1 illustrates a cross-sectional view of some embodiments of a laterally-diffused metal-oxide semiconductor (LDMOS) transistor having a field plate arranged over a field plate dielectric layer and laterally surrounded by a spacer structure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A laterally-diffused metal-oxide semiconductor (LDMOS) transistor is a high voltage device commonly used in amplifiers, such as microwave power amplifiers, audio power amplifiers, and radio frequency (RF) amplifiers. For example, in some RF amplifiers, an LDMOS transistor is coupled to integrated into the RF amplifier to assist with envelope tracking, wherein the power supplied to the RF amplifier is continuously manipulated to increase the efficiency of the RF amplifier. In some instances, an LDMOS transistor has a field plate that is a conductive element arranged over a drift region to enhance the performance of the device by manipulating electric fields (e.g., reducing peak electric fields) generated by a gate electrode. By manipulating the electric field generated by a gate electrode, the LDMOS transistor may achieve higher breakdown voltages.

In some embodiments, the field plate in the LDMOS transistor is arranged between a drain region and a gate electrode. To reduce the capacitance between the gate electrode and the drain region, the field plate is spaced apart from the gate electrode, and the field plate may be electrically coupled to a source region. By reducing the capacitance between the gate electrode and the drain region, the resistance to turn on the LDMOS transistor is reduced and thus, power loss of the LDMOS during on and off switching is reduced.

In some instances, to form an LDMOS transistor comprising a field plate and a gate electrode, a gate dielectric layer and a field plate dielectric layer are formed over a substrate. The field plate dielectric layer may be greater in thickness than the gate dielectric layer. Then, the field plate and the gate electrode may be formed simultaneously by depositing an electrode layer over a gate dielectric layer and a field plate dielectric layer, and portions of the electrode layer are removed to form the field plate arranged over the field plate dielectric layer and spaced apart from the gate electrode arranged over the gate dielectric layer. However, in such embodiments, the width of the gate dielectric layer and the field plate dielectric layer may be large in order to accommodate for a larger processing window that may be needed to ensure that the field plate is formed directly over the field plate dielectric layer and that the gate electrode is formed directly over the gate dielectric layer.

Various embodiments of the present disclosure relate to reducing the spacing between a field plate and a gate electrode in a high power device (e.g., LDMOS transistor) by forming the field plate before forming the gate electrode. In some embodiments, a continuous field plate dielectric layer may be formed over a substrate, and then, a field plate layer is formed over the field plate dielectric layer. The continuous field plate dielectric layer and the field plate layer may be patterned together using spacer structures in order to form the field plate over the field plate dielectric layer. In such embodiments, a width of the field plate dielectric layer is reduced because a large processing window for the field plate to land on the field plate dielectric layer is no longer needed. Thus, the overall area of the high power device (e.g., LDMOS device) may be reduced by about 15 to 20 percent on the substrate, thereby increasing device density without sacrificing the reliability of the high power device (e.g., LDMOS device).

FIG. 1 illustrates a cross-sectional view 100 of some embodiments of an LDMOS transistor comprising a field plate dielectric layer that is completely spaced apart from a gate dielectric layer.

The cross-sectional view 100 of FIG. 1 includes a first source/drain region 106a and a second source/drain region 106b arranged within a substrate 102. In some other embodiments, the first and second source/drain regions 106a, 106b may be arranged over the substrate 102. In some embodiments, the first and second source/drain regions 106a, 106b may have a first doping type (e.g., n-type) with a first concentration of dopants. In some embodiments, the second source/drain region 106b is also arranged within a low doped drift region 104 of the substrate 102. In such embodiments, the low doped drift region 104 may be a portion of the substrate 102 having the first doping type (e.g., n-type) with a second concentration of dopants that is less than the first concentration of dopants. In some embodiments, the first source/drain region 106a is spaced apart from the low doped drift region 104, and a channel region 107 separates the first source/drain region 106a from the low doped drift region 104. In some embodiments, the first source/drain region 106a may correspond to a source region, and the second source/drain region 106b may correspond to a drain region. In some embodiments, the substrate 102 is undoped or is doped and has a second doping type (e.g., p-type) that is different than the first doping type (e.g., n-type).

Further, a field plate 108 and a gate electrode 110 are arranged over the substrate 102. The field plate 108 is laterally separated from the gate electrode 110. In some embodiments, the field plate 108 directly overlies the low doped drift region 104, and the gate electrode 110 directly overlies the channel region 107. In some embodiments, the field plate 108 is arranged directly over a field plate dielectric layer 112, and the gate electrode 110 is arranged directly over a gate dielectric layer 116. In some embodiments, the gate dielectric layer 116 is spaced apart and thus, does not contact the field plate dielectric layer 112. In some embodiments, the field plate dielectric layer 112 comprises a central portion 112c and an outer portion 112p that surrounds the central portion 112c. In some embodiments, the central portion 112c of the field plate dielectric layer 112 is thicker than the outer portion 112p of the field plate dielectric layer 112. Further, in some embodiments, the field plate 108 directly overlies the central portion 112c of the field plate dielectric layer 112 and does not directly overlie the outer portion 112p of the field plate dielectric layer 112. In some embodiments, a spacer structure 114 laterally surrounds the field plate 108 and directly overlies the outer portion 112p of the field plate dielectric layer 112. In such embodiments, the spacer structure 114 may have a bottommost surface that is below a bottommost surface of the field plate 108. In some embodiments, the spacer structure 114 is used to protect the field plate 108 during the formation of the field plate 108 over the field plate dielectric layer 112, and is also used to protect the field plate 108 while the gate electrode 110 is formed after the formation of the field plate 108. In some embodiments, the gate dielectric layer 116 is thinner than both the central and outer portions 112c, 112p of the field plate dielectric layer 112. The field plate 108 distributes the electric field traveling between the second source/drain region 106b and the channel region 107. In such embodiments, the field plate dielectric layer 112 may be thicker than the gate dielectric layer 116 because the field plate dielectric layer 112 has a higher breakdown voltage than the gate dielectric layer 116.

In some embodiments, a topmost surface 108t of the field plate 108 is substantially coplanar with a topmost surface 110t of the gate electrode 110. In some embodiments, a dielectric spacer layer 118 may surround the gate electrode 110 and the field plate 108. In some embodiments, the spacer structure 114 may be arranged directly between the dielectric spacer layer 118 and the field plate 108. In some embodiments, the dielectric spacer layer 118 may protect outer sidewalls of the field plate 108 and the gate electrode 110, as well as provide electrical isolation between the field plate 108 and the gate electrode 110.

In some embodiments, an interconnect structure 120 is formed over the substrate 102, the field plate 108, and the gate electrode 110. In such embodiments, the interconnect structure 120 comprises interconnect vias 122 and interconnect wires 124 embedded within an interconnect dielectric structure 126. In some embodiments, to reduce capacitance between the gate electrode 110 and the second source/drain region 106b, the field plate 108 is electrically coupled to the first source/drain region 106a through the interconnect vias 122 and the interconnect wires 124.

Figure 2:
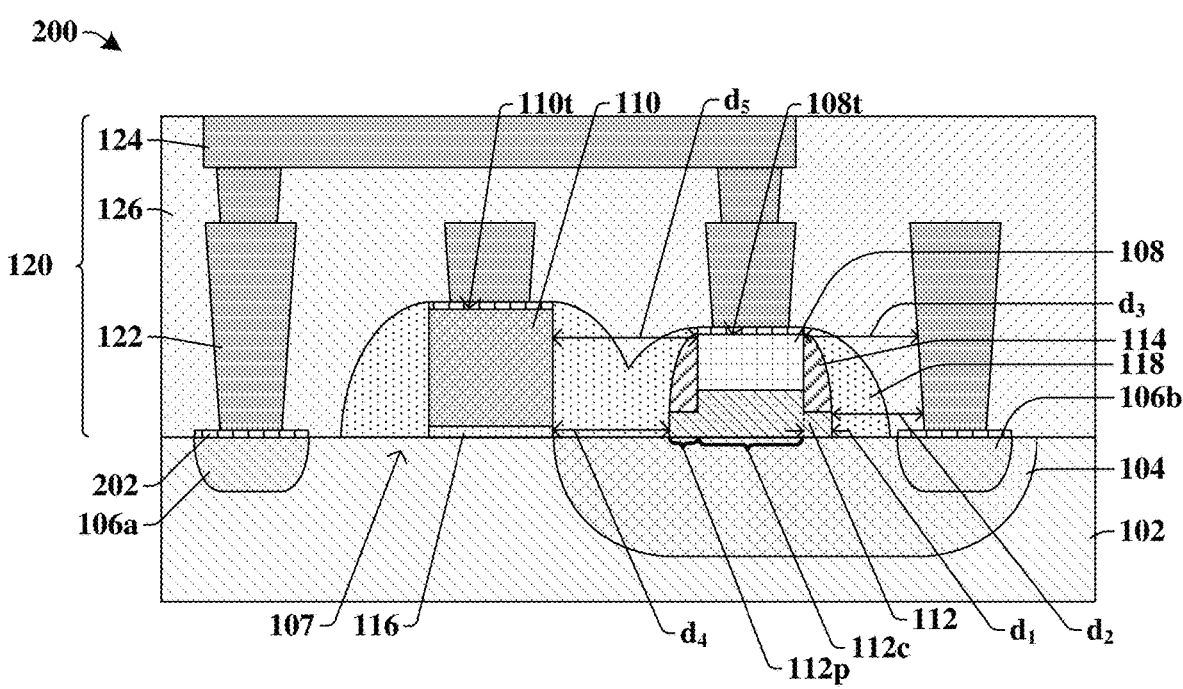
FIG. 2 illustrates a cross-sectional view of some alternative embodiments of the LDMOS transistor of FIG. 1, wherein the field plate has a topmost surface that is below a topmost surface of a gate electrode.

In some embodiments, the field plate 108 is formed prior to the gate electrode 110, and the field plate 108 is patterned simultaneously with the field plate dielectric layer 112. Further, in some embodiments, the gate electrode 110 is formed simultaneously with the gate dielectric layer 116. In such embodiments, the spacing between the field plate 108 and the gate electrode 110 is more controllable, and thus, the distance between the field plate 108 and the gate electrode 110 may be reduced to increase device density of the LDMOS transistor without sacrificing electrical performance FIG. 2 illustrates a cross-sectional view 200 of some alternative embodiments of an LDMOS transistor.

In some embodiments, silicide layers 202 may be formed directly on the first source/drain region 106a, the second source/drain region 106b, the field plate 108, and/or the gate electrode 110. In some embodiments, the silicide layers 202 may comprise, for example, cobalt silicide, titanium silicide, nickel silicide, or some other suitable metallic silicide material. In such embodiments, the silicide layers 202 may aid in coupling the interconnect vias 122 to the first source/drain region 106a, the second source/drain region 106b, the field plate 108, and/or the gate electrode 110.

Further, in some embodiments, the topmost surface 110t of the gate electrode 110 may be arranged above the topmost surface 108t of the field plate 108. In such embodiments, a planarization step on the gate electrode 110 and/or the field plate 108 during manufacturing may be omitted to increase manufacturing cost and time efficiency, but simultaneously forming interconnect vias 122 on the field plate 108 and the gate electrode 110 may be challenging when the topmost surface 110t of the gate electrode 110 is not substantially coplanar with the topmost surface 108t of the field plate 108. In some embodiments, the thickness of the gate electrode 110 and the field plate 108 may each be in a range of between, for example, approximately 100 angstroms and approximately 2000 angstroms. In some embodiments, the gate dielectric layer 116 and the field plate dielectric layer 112 may each have a thickness in a range of between, for example, approximately 10 angstroms and approximately 1000 angstroms.

In some embodiments, the outer portion 112p of the field plate dielectric layer 112 has a width equal to a first distance $d_1$. In some embodiments, the first distance $d_1$ may be in a range of between approximately 5 nanometers and approximately 15 nanometers, for example. In some embodiments, the field plate dielectric layer 112 is spaced apart from the interconnect via 122 arranged over the second source/drain region 106b by a second distance $d_2$ that is in a range of between, for example, approximately 35 nanometers and approximately 40 nanometers. In some embodiments, the field plate 108 is spaced apart from the interconnect via 122 arranged over the second source/drain region 106b by a third distance $d_3$ that is in a range of between, for example, approximately 45 nanometers and approximately 50 nanometers. In some embodiments, the field plate dielectric layer 112 is spaced apart from the gate dielectric layer 116 by a fourth distance $d_4$ that is in a range of between, for example, approximately 50 nanometers and approximately 60 nanometers. In some embodiments, the field plate 108 is spaced apart from the gate electrode 110 by a fifth distance $d_5$ that is in a range of between, for example, approximately 60 nanometers and approximately 70 nanometers. In some embodiments, because the field plate 108 and the field plate dielectric layer 112 are formed simultaneously and are formed prior to the gate electrode 110 and the gate dielectric layer 116, the width of the field plate dielectric layer 112 may be reduced such that the area of the LDMOS transistor is reduced by about 15 to 20 percent.

Figure 3:
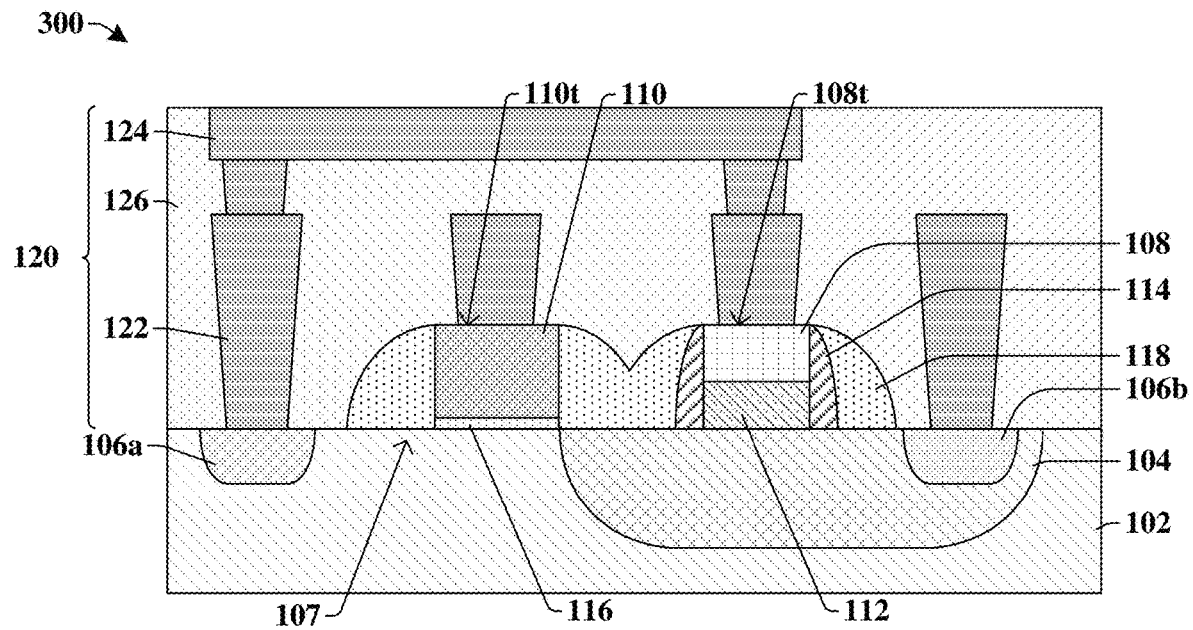
FIG. 3 illustrates a cross-sectional view of yet some other embodiments of an LDMOS transistor comprising a field plate dielectric layer that is thicker than and separated from a gate dielectric layer.

FIG. 3 illustrates a cross-sectional view 300 of yet some other embodiments of an LDMOS transistor comprising a field plate arranged over a field plate dielectric layer and surrounded by a spacer structure.

In some embodiments, the field plate dielectric layer 112 has a substantially uniform thickness throughout its width. Thus, in some embodiments, the field plate dielectric layer 112 may not have the outer portions (112p of FIG. 2). In such embodiments, bottom surfaces of the spacer structure 114 and the field plate dielectric layer 112 may directly contact the substrate 102.

In some embodiments, the gate dielectric layer 116 and the field plate dielectric layer 112 comprise a same material, whereas in other embodiments, the gate dielectric layer 116 and the field plate dielectric layer 112 may comprise different materials. Similarly, in some embodiments, the spacer structure 114 comprises a same material as the field plate dielectric layer 112, whereas in other embodiments, the spacer structure 114 comprises a different material than the field plate dielectric layer 112. In yet some other embodiments, the spacer structure 114 may comprise multiple layers of materials. In some embodiments, the gate dielectric layer 116, the field plate dielectric layer 112, and the spacer structure 114 may comprise, for example, one or more of the following materials: an oxide (e.g., silicon dioxide), silicon oxynitride, silicon nitride, or the like.

Further, because the gate electrode 110 is formed separately from the field plate 108, in some embodiments, the gate electrode 110 may comprise a different material than the field plate 108. In some other embodiments, the gate electrode 110 comprises a same material as the field plate 108. In some embodiments, the field plate 108 and the gate electrode 110 may comprise one or more of the following materials: a semiconductor material (e.g., polysilicon, amorphous silicon), a metal (e.g., titanium nitride, titanium, tantalum nitride, tantalum, aluminum, tungsten), or some other suitable conductive material.

In some embodiments, the dielectric spacer layer 118 and/or the interconnect dielectric structure 126 may comprise, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. Further, in some embodiments, the interconnect vias 122 and the interconnect wires 124 may comprise a conductive material such as, for example, titanium, tantalum, aluminum, tungsten, copper, or some other suitable conductive material.

Figure 4:
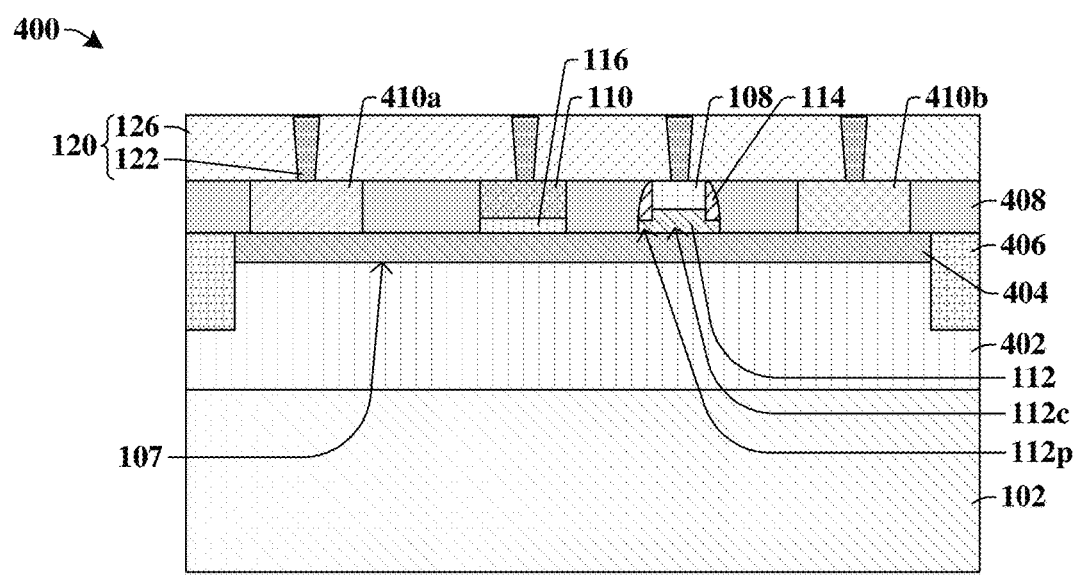
FIG. 4 illustrates a cross-sectional view of some embodiments of a III/V power device having a field plate arranged over a field plate dielectric layer and laterally surrounded by a spacer structure.

FIG. 4 illustrates a cross-sectional view 400 of some embodiments of a GaN or III/V power device having a field plate arranged over a field plate dielectric layer and laterally surrounded by a spacer structure.

In some embodiments, the field plate 108 and the gate electrode 110 are formed over an active layer 404 of a III/V semiconductor device. In such embodiments, a channel layer 402 may be arranged on the substrate 102 and between the substrate 102 and the active layer 404. In some embodiments, the channel layer 402 comprises a binary III/V semiconductor (e.g., a first III-nitride material like gallium nitride or gallium arsenide) and the active layer 404 comprises a ternary III/V semiconductor (e.g., a second III-nitride material like aluminum gallium nitride or aluminum gallium arsenide). In some embodiments, a first source/drain contact 410a is arranged over the active layer 404, and a second source/drain contact 410b is arranged over the active layer 404. In some embodiments, the first and second source/drain contacts 410a, 410b comprise a conductive material such as titanium, tantalum, aluminum, or the like. In some embodiments, the first source/drain contact 410a, the second source/drain contact 410b, the gate electrode 110, and the field plate 108 are laterally surrounded by a passivation layer 408. Further, in some embodiments, an isolation structure 406 may surround outer sidewalls of the active layer 404 and upper portions of the channel layer 402.

In some embodiments of a III/V power device, the field plate 108 is arranged over the field plate dielectric layer 112 and surrounded by the spacer structure 114, and the gate electrode 110 is arranged over the gate dielectric layer 116 and is spaced apart from the field plate 108. It will be appreciated that the field plate 108 arranged over the field plate dielectric layer 112 and surrounded by the spacer structure 114 that is formed prior to the gate electrode 110 may also be used in devices other than a III/V power device or a LDMOS transistor, and such other embodiments are also within the scope of this disclosure.

During operation of the III/V power device, a heterojunction that acts as the channel region 107 is formed at an interface between the active layer 404 and the channel layer 402. Current flows through the channel region 107, and the field plate 108 may be controlled to manipulate the electric fields in the channel region 107 to reduce the breakdown voltage of the III/V power device. Because the field plate 108 is formed prior to the gate electrode 110 and because the field plate 108 is formed simultaneously with the field plate dielectric layer 112, the field plate 108 may be arranged closer to the gate electrode 110 and the second source/drain contact 410b to increase device density without sacrificing performance of the overall III/V power device.

FIGS. 5-21 illustrate cross-sectional views 500-2100 of some embodiments of a method of forming a high power device (e.g., an LDMOS transistor) over a substrate wherein a field plate is formed before a gate electrode to reduce the size of the high power device. Although FIGS. 5-21 are described in relation to a method, it will be appreciated that the structures disclosed in FIGS. 5-21 are not limited to such a method, but instead may stand alone as structures independent of the method.

Figure 5:
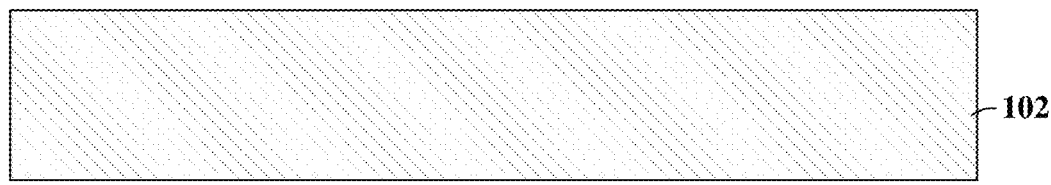
FIGS. 5-21 illustrate cross-sectional views of some embodiments of a method of forming a high power device by forming a field plate before forming a gate electrode laterally beside the field plate to reduce the spacing between the field plate and gate electrode.

As shown in cross-sectional view 500 of FIG. 5, a substrate 102 is provided. In various embodiments, the substrate 102 may comprise any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated therewith.

Figure 6:
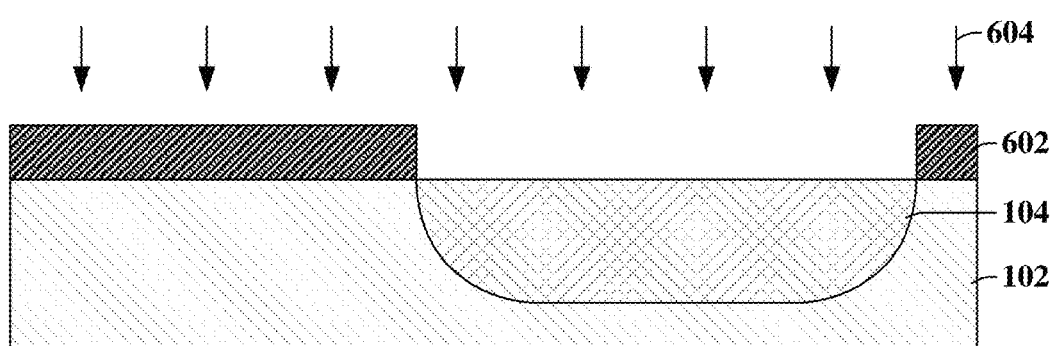

As shown in cross-sectional view 600 of FIG. 6, in some embodiments, a first masking structure 602 is formed over the substrate 102, an ion implantation process 604 is performed to dope the substrate 102 and form a low doped drift region 104 within the substrate 102. In some embodiments, the first masking structure 602 may be formed using photolithography and removal (e.g., etching) processes. In some embodiments, the first masking structure 602 comprises a photoresist or a hard mask material. In some embodiments, the low doped drift region 104 may have a first doping type (e.g., n-type). Further, in some embodiments, the substrate 102 may be undoped or have a second doping type (e.g., p-type) that is different than the first doping type (e.g., n-type). In other embodiments, the formation of the low doped drift region 104 may be omitted, such as, for example, when the device to be formed is a III/V power device as illustrated in FIG. 4.

Figure 7:
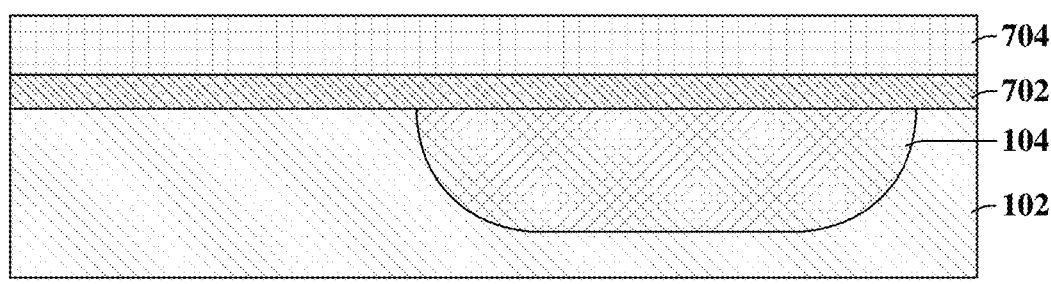

As shown in cross-sectional view 700 of FIG. 7, in some embodiments, a continuous field plate dielectric layer 702 is formed over the substrate 102. Further, in some embodiments, a continuous field plate layer 704 is formed over the continuous field plate dielectric layer 702. In some embodiments, the continuous field plate dielectric layer 702 may be formed by way of a thermal oxidation process, an in-situ steam generation (ISSG) oxide process, or some other deposition process (e.g., physical vapor deposition (PVD), chemical vapor deposition (CVD), atomic layer deposition (ALD), etc.). In some embodiments, the continuous field plate dielectric layer 702 may comprise, for example, an oxide (e.g., silicon dioxide), silicon oxynitride, silicon nitride, or the like. In some embodiments, the continuous field plate dielectric layer 702 may have a thickness in a range of between, for example, approximately 10 angstroms and approximately 1000 angstroms.

In some embodiments, the continuous field plate layer 704 may comprise, for example, a semiconductor material (e.g., polysilicon, amorphous silicon), a metal (e.g., titanium nitride, titanium, tantalum nitride, tantalum, aluminum, tungsten), or some other suitable conductive material. Further, in some embodiments, the continuous field plate layer 704 may be formed by way a deposition process (e.g., PVD, CVD, ALD, sputtering, etc.). In some embodiments, the continuous field plate layer 704 may have a thickness in a range of between, for example, approximately 100 angstroms and approximately 2000 angstroms.

Figure 8:
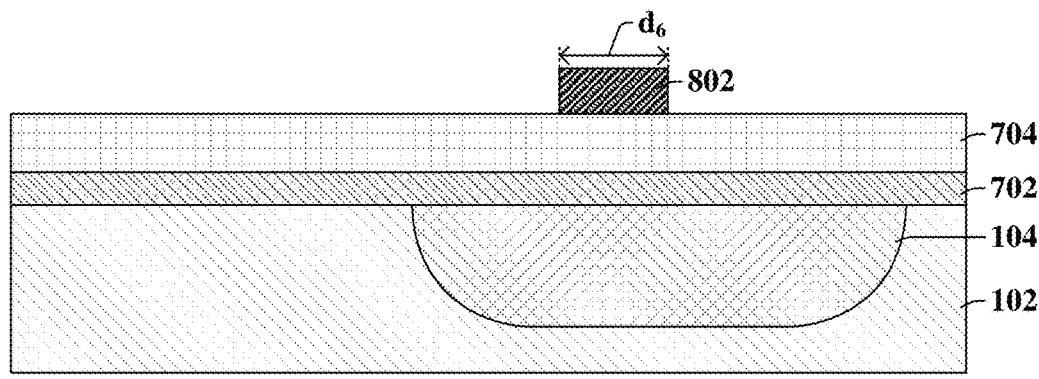

As shown in cross-sectional view 800 of FIG. 8, in some embodiments, a second masking structure 802 is formed over the continuous field plate layer 704. In some embodiments, the second masking structure 802 directly overlies the low doped drift region 104. The second masking structure 802 may be formed using photolithography and removal (e.g., etching) processes and comprises a photoresist or a hard mask material, in some embodiments. In some embodiments, the second masking structure 802 may have a width equal to a sixth distance $d_6$ that is in a range of between, for example, approximately 10 nanometers and approximately 1 micrometer.

Figure 9:
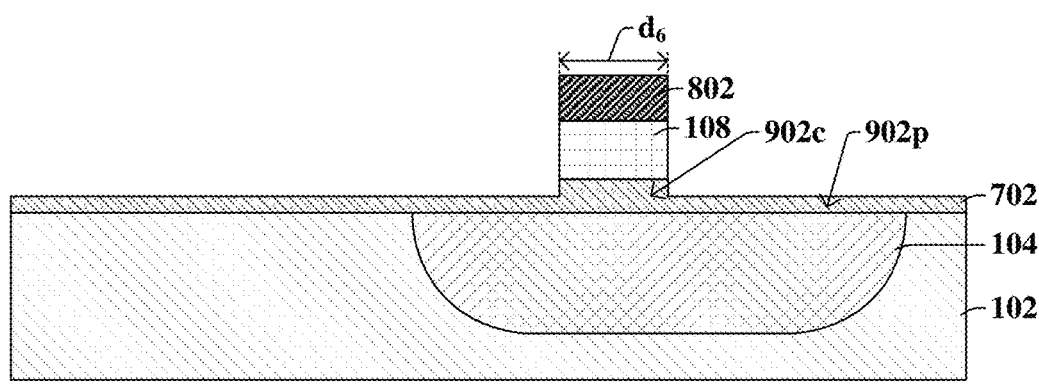

As shown in cross-sectional view 900 of FIG. 9, in some embodiments, a removal process is performed to remove outer portions of the continuous field plate layer (704 of FIG. 7) according to the second masking structure 802 to form a field plate 108 over the substrate 102. In some embodiments, after the removal process to form the field plate 108, the continuous field plate dielectric layer 702 comprises an outer portion 902p that is thinner than a central portion 902c, wherein the central portion 902c of the continuous field plate dielectric layer 702 directly and completely underlies the second masking structure 802. In such embodiments, the removal process also removes upper portions of the continuous field plate dielectric layer 702 uncovered by the second masking structure 802, but does not completely remove the continuous field plate dielectric layer 702 that is uncovered by the second masking structure 802. Thus, after the removal process to form the field plate 108, the outer portion 902p of the continuous field plate dielectric layer 702 completely covers the substrate 102. The outer portion 902p of the continuous field plate dielectric layer 702 may protect the substrate 102 from future processing steps, such as dry/plasma etching, for example.

In some other embodiments, the removal process to form the field plate 108 may completely remove portions of the continuous field plate dielectric layer 702 uncovered by the second masking structure 802. In such other embodiments, the substrate 102 may become damaged from future processing steps such as, for example, dry/plasma etching.

In some embodiments, the removal process may be or comprise a dry etching process. In some embodiments, the removal process may comprise a first dry etchant used to remove portions of the continuous field plate layer (704 of FIG. 8), and a second dry etchant used to remove portions of the continuous field plate dielectric layer 702. In some embodiments, the second dry etchant is different than the first dry etchant, whereas in other embodiments, a same dry etchant is used for the removal process. In some embodiments, the first dry etchant may be or comprise, for example, $CF_4$, $CHF_3$, $C_4F_8$, or the like, and the second dry etchant may be or comprise, for example, chlorine, argon, $HBr_4$, or the like.

Figure 10:
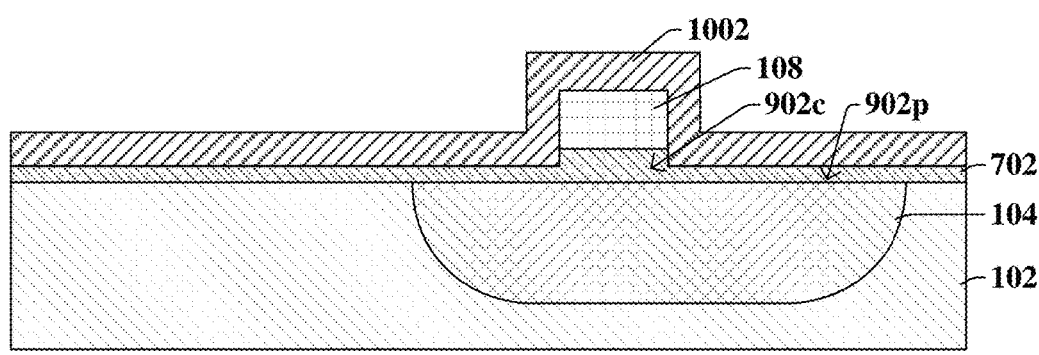

As shown in cross-sectional view 1000 of FIG. 10, in some embodiments, a continuous spacer layer 1002 is formed over the substrate 102. In some embodiments, prior to the continuous spacer layer 1002, the second masking structure (802 of FIG. 9) may be removed by, for example, a wet chemical etchant. In other embodiments, the second masking structure (802 of FIG. 9) may remain on the field plate 108, and the continuous spacer layer 1002 may be formed over the second masking structure (802 of FIG. 9). Nevertheless, in some embodiments, the continuous spacer layer 1002 may be formed over the continuous field plate dielectric layer 702 and over the field plate 108.

In some embodiments, the continuous spacer layer 1002 may be formed by way of a thermal oxidation process and/or a deposition process (e.g., PVD, CVD, ALD, sputtering, etc.). In some embodiments, the continuous spacer layer 1002 may comprise, for example, an oxide (e.g., silicon dioxide), silicon oxynitride, silicon nitride, or the like. In some embodiments, the continuous spacer layer 1002 may comprise multiple layers of the aforementioned materials. In some embodiments, the continuous spacer layer 1002 may have a thickness in a range of between, for example, approximately 5 nanometers and approximately 15 nanometers.

Figure 11:
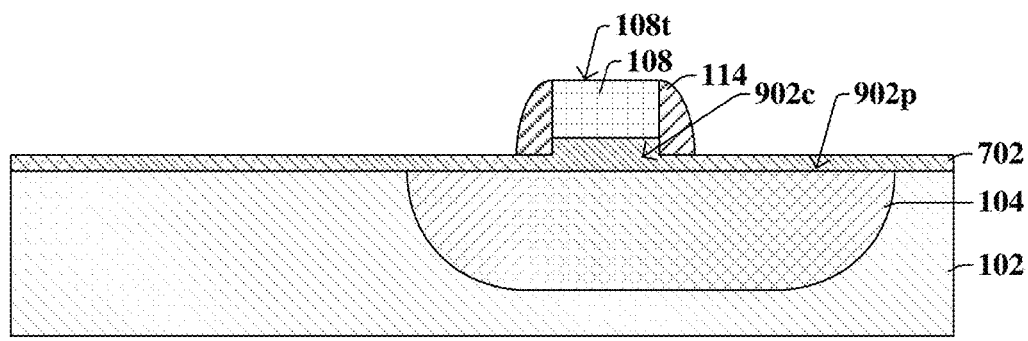

As shown in cross-sectional view 1100 of FIG. 11, in some embodiments, a removal process is performed to remove substantially horizontal portions of the continuous spacer layer (1002 of FIG. 10) to form a spacer structure 114 surrounding the field plate 108. In some embodiments, the spacer structure 114 is arranged on the outer portion 902p of the continuous field plate dielectric layer 702 and is arranged at a same height from the substrate 102 as the field plate 108. In some embodiments, the spacer structure 114 has substantially curved outer sidewalls, whereas in other embodiments, the spacer structure 114 may have planar/straight sidewalls, jagged/rough sidewalls, or a combination thereof. In some embodiments, the spacer structure 114 does not cover a topmost surface 108t of the field plate 108. In some embodiments, the removal process may be a dry etching process conducted in the substantially vertical direction. In such embodiments, a masking structure is may not be needed to form the spacer structure 114. In some embodiments, the removal process of FIG. 11 may comprise a dry etchant such as, for example, $CF_4$, $CHF_3$, $C_4F_8$, or the like. In some embodiments, the outer portion 902p of the continuous field plate dielectric layer 702 protects the substrate 102 from damage by the removal process used to form the spacer structure 114.

In some embodiments, the spacer structure 114 and the continuous field plate dielectric layer 702 comprise a same material. In such embodiments, the removal process of FIG. 11 may be controlled by a predetermined etching time based on the thickness of the continuous spacer layer (1002 of FIG. 10). For example, in some embodiments, the removal process of FIG. 11 may be conducted for the predetermined etching time to remove the substantially horizontal portions of the continuous spacer layer (1002 of FIG. 10) without removing the continuous field plate dielectric layer 702. In some other embodiments, the removal process of FIG. 11 may remove some of the continuous field plate dielectric layer 702 such that the continuous field plate dielectric layer 702 is reduced in thickness; however, after the removal process of FIG. 11, the continuous field plate dielectric layer 702 still completely covers the substrate 102 to protect the substrate 102 from damage by the removal process of FIG. 11.

In yet some other embodiments, the removal process of FIG. 11 may not be performed long enough to completely remove the substantially horizontal portions of the continuous spacer layer (1002 of FIG. 10). In such other embodiments, a thin layer of the continuous spacer layer (1002 of FIG. 10) may still remain on the continuous field plate dielectric layer 702 after the removal process of FIG. 11. In such other embodiments, the thin layer (not shown) of the continuous spacer layer (1002 of FIG. 10) may be removed, for example, by the removal process of FIG. 12.

Figure 12:
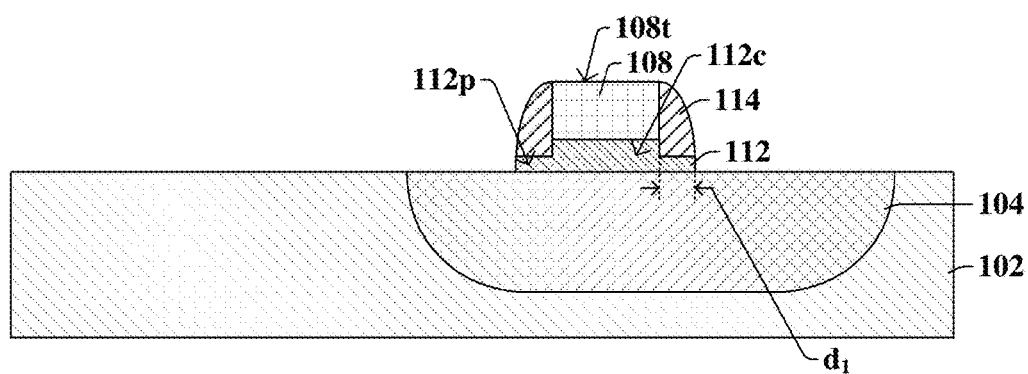

As shown in cross-sectional view 1200 of FIG. 12, in some embodiments, a removal process is performed to remove the outer portion (902p of FIG. 11) of the continuous field plate dielectric layer (702 of FIG. 11) that is not covered by the spacer structure 114 thereby forming a field plate dielectric layer 112 arranged below the field plate 108 and the spacer structure 114. In some other embodiments, the removal process of FIG. 12 may also remove any remaining portions (not shown) of the continuous spacer layer (1002 of FIG. 10) arranged directly on the outer portion (902p of FIG. 11) of the continuous field plate dielectric layer (702 of FIG. 11). Further, in some embodiments, if the field plate dielectric layer 112 and the spacer structure 114 comprise a same material, the spacer structure 114 may be reduced in size by the removal process of FIG. 12. However, in such embodiments, the spacer structure 114 after the removal process of FIG. 12 may still be present to help define the field plate dielectric layer 112 formed by the removal process of FIG. 12.

In some embodiments, the field plate dielectric layer 112 comprises an outer portion 112p arranged directly below the spacer structure 114 and a central portion 112c surrounded by the outer portion 112p and arranged directly below the field plate 108. In some embodiments, the central portion 112c of the field plate dielectric layer 112 is thicker than the outer portion 112p of the field plate dielectric layer 112. In some embodiments, outer portion 112p of the field plate dielectric layer 112 has a width equal to a first distance $d_1$. In some embodiments, the first distance $d_1$ may be in a range of between approximately 5 nanometers and approximately 15 nanometers, for example.

In some embodiments, the removal process to form the field plate dielectric layer 112 may be or comprise a wet etch. In some embodiments, the wet etch may remove the outer portion (902p) of the continuous field plate dielectric layer (702 of FIG. 11) without damaging the substrate 102. In some embodiments, a masking structure is not needed to perform the removal process to form the field plate dielectric layer 112. In some other embodiments, the removal process of FIG. 12 may comprise a dry etchant such as, for example, $CF_4$, $CHF_3$, $C_4F_8$, or the like. Further, in some other embodiments, the removal process of FIG. 11 and FIG. 12 may comprise a same dry etchant and may be performed simultaneously, in a single step. In other embodiments, the removal process of FIG. 11 and the removal process of FIG. 12 may be performed separately using different etchants.

Because the field plate dielectric layer 112 is formed according to the field plate 108 and the spacer structure 114, the field plate dielectric layer 112 may be considered to be formed with the field plate 108 in a self-aligned process. This way, the field plate dielectric layer 112 and the field plate 108 may have a smaller width, thereby reducing the device density of the overall LDMOS transistor.

Figure 13:
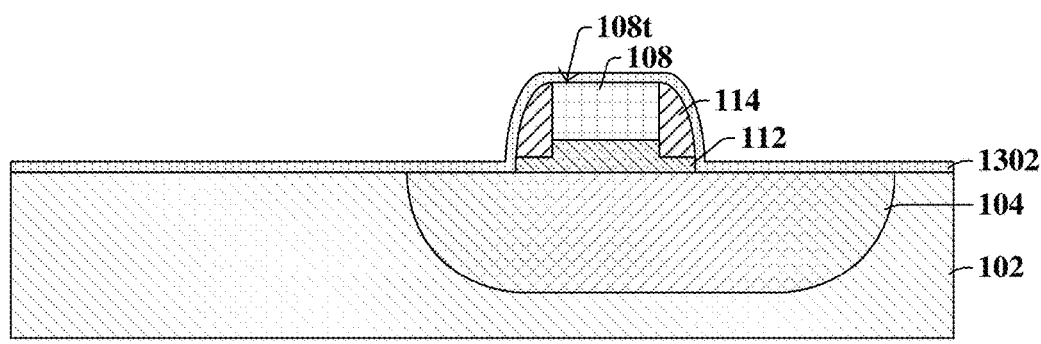

As shown in cross-sectional view 1300 of FIG. 13, in some embodiments, a continuous gate dielectric layer 1302 may be formed over the substrate 102. In some embodiments, the continuous gate dielectric layer 1302 may be formed by way of a thermal oxidation process and/or a deposition process (e.g., PVD, CVD, ALD, sputtering, etc.). In some embodiments, the continuous gate dielectric layer 1302 may comprise, for example, an oxide (e.g., silicon dioxide), silicon oxynitride, silicon nitride, or the like. In some embodiments, the continuous gate dielectric layer 1302 may have a thickness in a range of between, for example, approximately 10 angstroms and approximately 1000 angstroms. In some embodiments, the thickness of the continuous gate dielectric layer 1302 may be less than the thickness of the outer and central portions 112p, 112c of the field plate dielectric layer 112.

Figure 14:
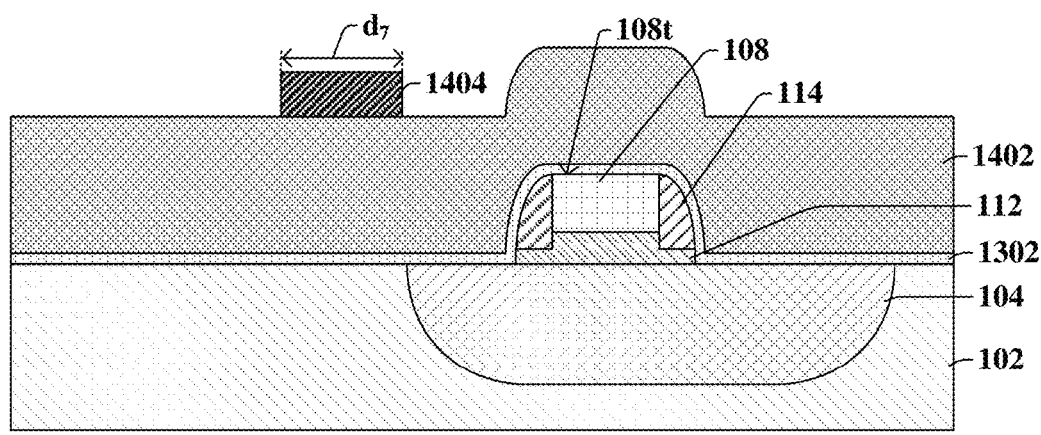

As shown in cross-sectional view 1400 of FIG. 14, in some embodiments, a continuous gate layer 1402 is formed over the continuous gate dielectric layer 1302. In some embodiments, the continuous gate layer 1402 comprises a same material as the field plate 108, whereas in other embodiments, the continuous gate layer 1402 comprises a different material than the field plate 108. In some embodiments, the continuous gate layer 1402 may comprise, for example, a semiconductor material (e.g., polysilicon, amorphous silicon), a metal (e.g., titanium nitride, titanium, tantalum nitride, tantalum, aluminum, tungsten), or some other suitable conductive material. Further, in some embodiments, the continuous gate layer 1402 may be formed by way a deposition process (e.g., PVD, CVD, ALD, sputtering, etc.). In some embodiments, the continuous gate layer 1402 may have a thickness in a range of between, for example, approximately 100 angstroms and approximately 2000 angstroms.

Further, in some embodiments, a third masking structure 1404 is formed over the continuous gate layer 1402. The third masking structure 1404 may be formed using photolithography and removal (e.g., etching) processes and comprises a photoresist or a hard mask material, in some embodiments. In some embodiments, the third masking structure 1404 may have a width equal to a seventh distance $d_7$ that is in a range of between, for example, approximately 10 nanometers and approximately 1 micrometer. In some embodiments, the third masking structure 1404 partially overlies or does not overlie the low doped drift region 104.

Figure 15:
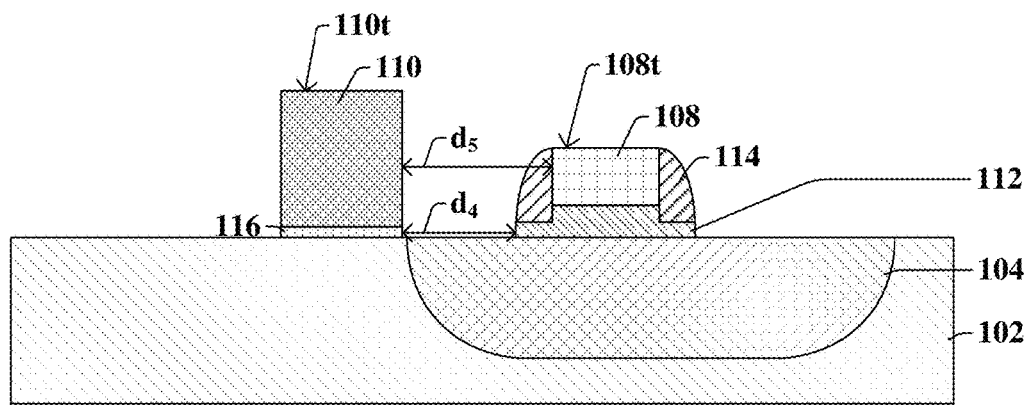

As shown in cross-sectional view 1500 of FIG. 15, in some embodiments, a removal process is performed to remove outer portions of the continuous gate dielectric layer (1302 of FIG. 14) and the continuous gate layer (1402 of FIG. 14) according to the third masking structure (1404 of FIG. 14) to form a gate electrode 110 over a gate dielectric layer 116. In some embodiments, the removal process may be or comprise a dry etching process. In some embodiments, the removal process of FIG. 15 may comprise a first dry etchant used to remove portions of the continuous gate layer (1402 of FIG. 14), and a second dry etchant used to remove portions of the continuous gate dielectric layer (1302 of FIG. 14). In some embodiments, the second dry etchant is different than the first dry etchant, whereas in other embodiments, a same dry etchant is used for the removal process. In some embodiments, the first dry etchant may be or comprise, for example, $CF_4$, $CHF_3$, $C_4F_8$, or the like, and the second dry etchant may be or comprise, for example, chlorine, argon, $HBr_4$, or the like. In some embodiments, the third masking structure (1404 of FIG. 14) may be removed during the removal process of FIG. 15. In some embodiments, the removal of the third masking structure (1404 of FIG. 14) may be achieved by using a wet or dry etchant.

In some embodiments, the gate electrode 110 may have a topmost surface 110t that is above, below, or about the same height above the substrate 102 as the topmost surface 108t of the field plate 108. Further, in some embodiments, the gate dielectric layer 116 is completely separated from the field plate dielectric layer 112. In some embodiments, the gate dielectric layer 116 is arranged at a fourth distance $d_4$ from the field plate dielectric layer 112, and the gate electrode 110 is arranged at a fifth distance $d_5$ from the field plate 108. In some embodiments, the fourth distance $d_4$ is in a range of between, for example, approximately 50 nanometers and approximately 60 nanometers, and the fifth distance $d_5$ is in a range of between, for example, approximately 60 nanometers and approximately 70 nanometers. In some embodiments, because the field plate 108 and field plate dielectric layer 112 are formed prior to forming the gate electrode 110 and the gate dielectric layer 116, the fourth distance $d_4$ and/or the fifth distance $d_5$ are reduced, which may increase the device density of the overall LDMOS device by about 15 to 20 percent on the substrate 102.

In some embodiments, the removal process may be or comprise a dry etching process. In some embodiments, the removal process may comprise a first dry etchant used to remove portions of the continuous field plate layer (704 of FIG. 8), and a second dry etchant used to remove portions of the continuous field plate dielectric layer 702. In some embodiments, the second dry etchant is different than the first dry etchant, whereas in other embodiments, a same dry etchant is used for the removal process. In some embodiments, the first dry etchant may be or comprise, for example, $CF_4$, $CHF_3$, $C_4F_8$, or the like, and the second dry etchant may be or comprise, for example, chlorine, argon, $HBr_4$, or the like.

In some embodiments, the field plate dielectric layer 112 is thicker than the gate dielectric layer 116 to increase the breakdown voltage of the field plate 108, as the field plate 108 may experience higher voltage biases than the gate electrode 110.

Figure 16:
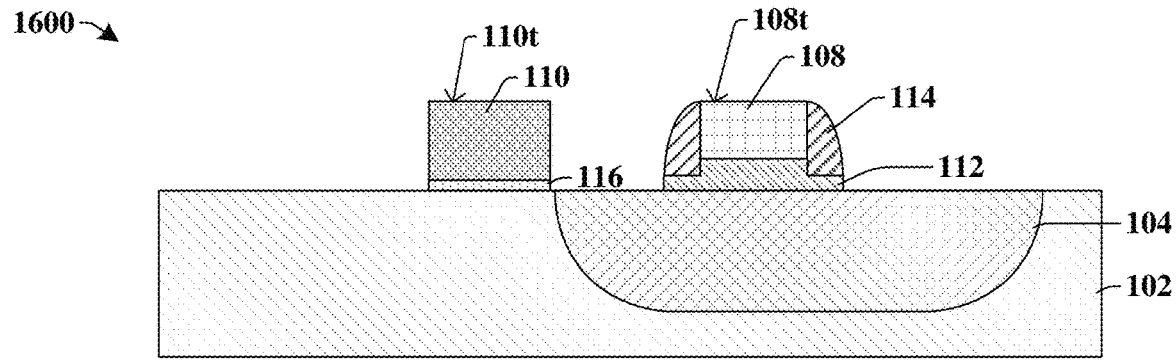

As shown in cross-sectional view 1600 of FIG. 16, in some embodiments, a planarization process (e.g., chemical mechanical planarization (CMP)) may be performed such that the topmost surface 110t of the gate electrode 110 is substantially coplanar with the topmost surface 108t of the field plate 108. The planarization process may remove upper portions of the gate electrode 110, the field plate 108, and/or the spacer structure 114. In some embodiments, because the gate dielectric layer 116 is thinner than the field plate dielectric layer 112, although the topmost surface 110t of the gate electrode is substantially coplanar with the topmost surface 108t of the field plate 108, the gate electrode 110 is thicker than the field plate 108. When the topmost surface 110t of the gate electrode 110 is substantially planar with the topmost surface 108t of the field plate 108, forming interconnect vias (e.g., 122 of FIG. 21) may be more controllable. However, in some embodiments, the planarization process of FIG. 16 may be omitted.

Figure 17:
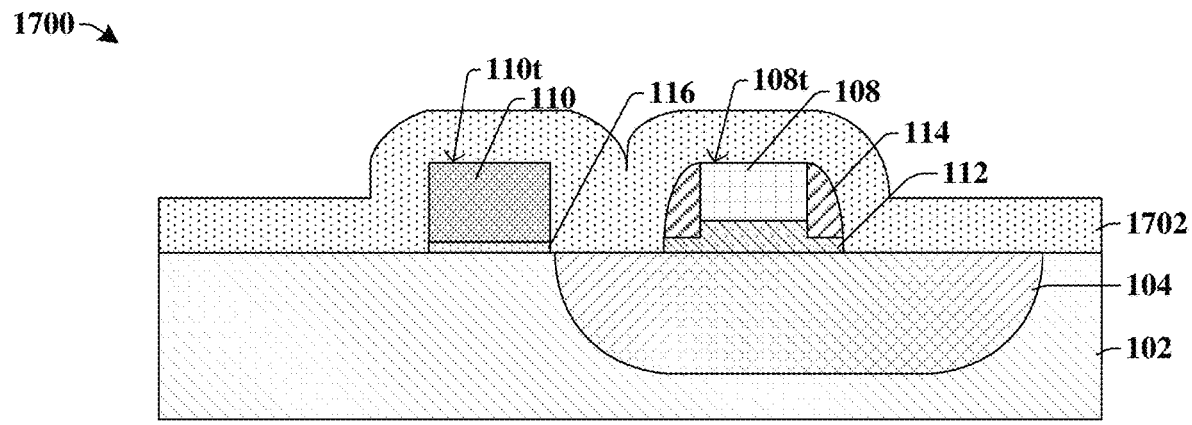

As shown in cross-sectional view 1700 of FIG. 17, in some embodiments, a conformal dielectric layer 1702 may be formed over the gate electrode 110 and the field plate 108. In some embodiments, the conformal dielectric layer 1702 may be formed by way of a thermal oxidation process and/or a deposition process (e.g., PVD, CVD, ALD, sputtering, etc.). In some embodiments, the conformal dielectric layer 1702 may comprise, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. Further, in some embodiments, the conformal dielectric layer 1702 may comprise may comprise multiple layers of the aforementioned materials.

Figure 18:
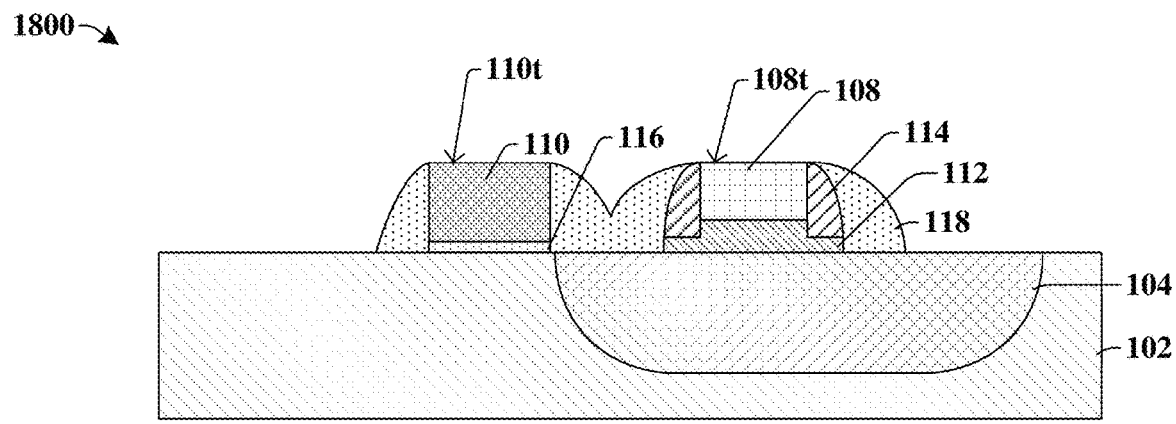

As shown in cross-sectional view 1800 of FIG. 18, in some embodiments, a removal process is performed to remove substantially horizontal portions of the conformal dielectric layer (1702 of FIG. 17) to form a dielectric spacer layer 118 laterally surrounding the gate electrode 110 and the spacer structure 114. In some embodiments, the dielectric spacer layer 118 provides structural protection to and electrical isolation between the gate electrode 110 and the field plate 108. In some embodiments, after the removal process of FIG. 18, the dielectric spacer layer 118 may have substantially curved outer sidewalls and upper surfaces, whereas in other embodiments the outer sidewalls and upper surfaces of the dielectric spacer layer 118 may be planar/slanted, jagged/rough, or a combination thereof, for example.

In some embodiments, the removal process of FIG. 18 may be a dry etching process conducted in the substantially vertical direction. In such embodiments, a masking structure is not needed to form the dielectric spacer layer 118. In some embodiments, the removal process of FIG. 18 may comprise a dry etchant such as, for example, $CF_4$, $CHF_3$, $C_4F_8$, or the like.

Figure 19:
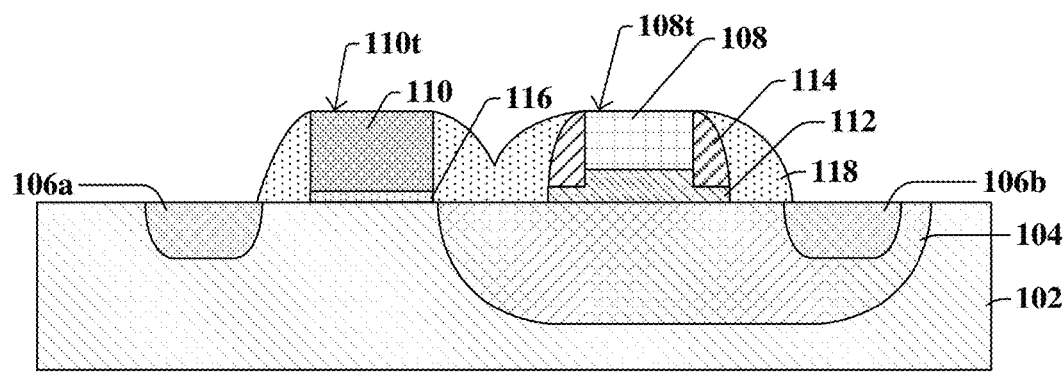

As shown in cross-sectional view 1900 of FIG. 19, in some embodiments, an ion implantation process is performed to dope regions of the substrate 102 to form a first source/drain region 106a and a second source/drain region 106b in the substrate 102. In some other embodiments, the first and second source/drain regions 106a, 106b may be formed over the substrate 102. In some embodiments, the first and second source/drain regions 106a, 106b may have the first doping type (e.g., n-type) and may have a doping concentration that is greater than a doping concentration of the low doped drift region 104. In some embodiments, a masking structure (not shown) may be used during the ion implantation process such that the first source/drain regions 106a, 106b are formed in a desired area on the substrate 102. In some embodiments, the gate electrode 110 and the field plate 108 are arranged between the first and second source/drain regions 106a, 106. In some embodiments, the first source/drain region 106a is the source region because it is arranged closer to the gate electrode 110 than the field plate 108, and the second source/drain region 106b is the drain region because it is arranged closer to the field plate 108 than the gate electrode 110.

Figure 20:
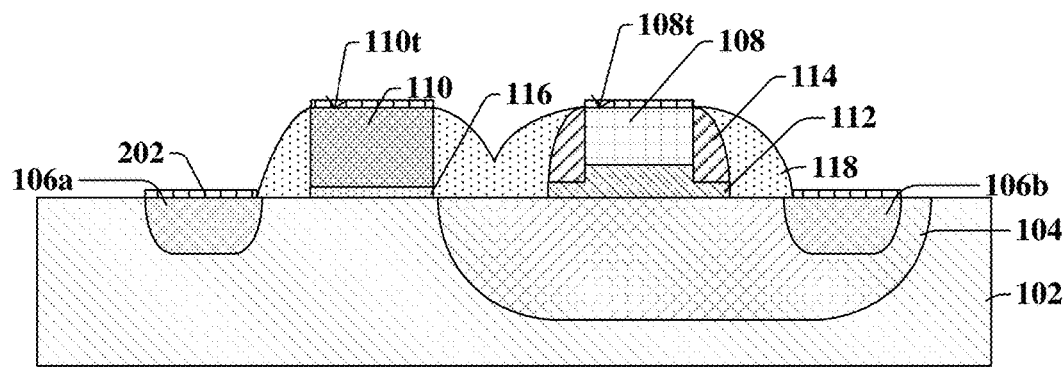

As shown in cross-sectional view 2000 of FIG. 20, in some embodiments, silicide layers 202 are formed over the first source/drain region 106a, the second source/drain region 106b, the field plate 108, and/or the gate electrode 110. In some embodiments, the silicide layer 202 may be formed by depositing a transition metal layer covering the first source/drain region 106a, the second source/drain region 106b, the field plate 108, and/or the gate electrode 110 and subsequently heating the transition metal layer so it reacts with the semiconductor material of the first source/drain region 106a, the second source/drain region 106b, the field plate 108, and/or the gate electrode 110. Thus, in some embodiments, the silicide layer 202 may comprise nickel silicide, titanium silicide, cobalt silicide, platinum silicide, tungsten silicide, or some other metal-semiconductor material. In some other embodiments, if the gate electrode 110 and/or the field plate 108 comprise a metal and not a semiconductor material, the silicide layers are not formed on the gate electrode 110 and/or the field plate 108.

Figure 21:
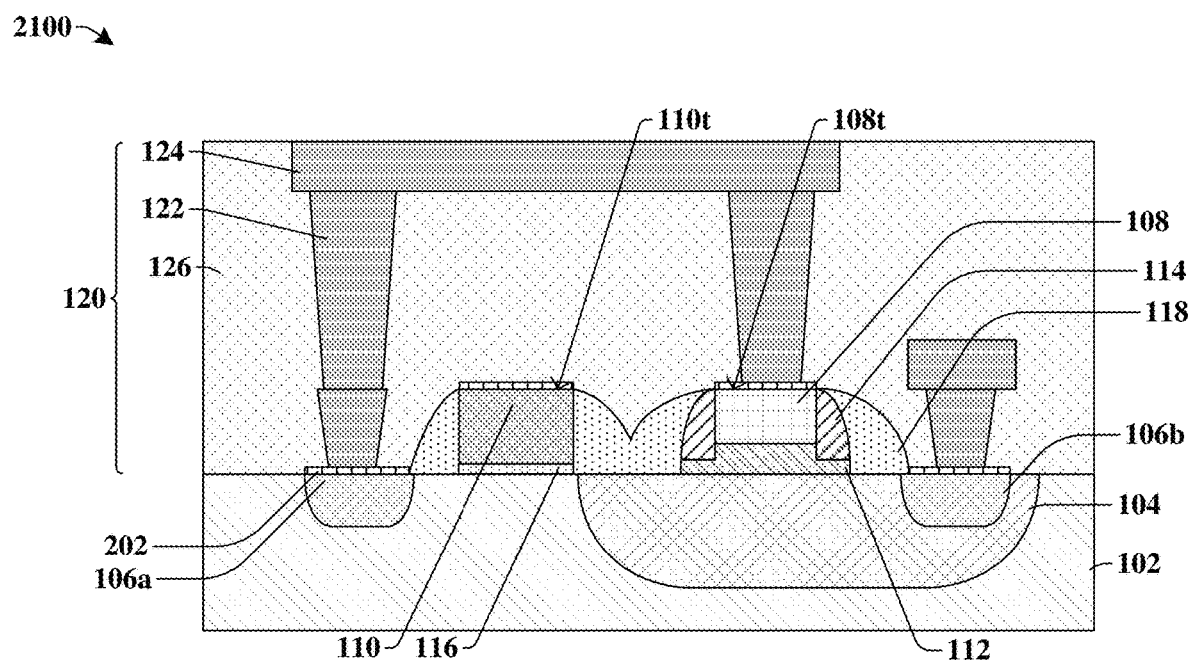

As shown in cross-sectional view 2100 of FIG. 21, in some embodiments, an interconnect structure 120 is formed over the substrate 102. In some embodiments, the interconnect structure 120 comprises a network of interconnect vias 122 and interconnect wires 124 coupled to the first source/drain region 106a, the second source/drain region 106b, the gate electrode 110, and/or the field plate 108. In some embodiments, the interconnect vias 122 and the interconnect wires 124 are embedded within an interconnect dielectric structure 126. In some embodiments, the interconnect structure 120 is formed through various steps of deposition processes (e.g., PVD, CVD, ALD, sputtering, etc.), removal processes (e.g., wet etching, dry etching, CMP), and/or patterning processes (e.g., photolithography/etching). For example, in some embodiments, the interconnect structure 120 is formed by way of single and/or dual damascene processes. In some embodiments, the interconnect dielectric structure 126 comprises, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. Further, in some embodiments, the interconnect vias 122 and the interconnect wires 124 may comprise a conductive material such as, for example, titanium, tantalum, aluminum, tungsten, copper, or some other suitable conductive material.

In some embodiments, the field plate 108 may be coupled to the first source/drain region 106a to reduce capacitance between the gate electrode 110 and the second source/drain region 106b. Further, in some embodiments, to reduce capacitance between the gate electrode 110 and the second source/drain region 106b, the field plate 108 is completely spaced apart from the gate electrode 110.

To reduce the capacitance between the gate electrode and the drain region, the field plate is spaced apart from the gate electrode, and the field plate may be electrically coupled to a source region. By reducing the capacitance between the gate electrode and the drain region, the resistance to turn on the LDMOS transistor is reduced and thus, power loss of the LDMOS during on and off switching is reduced. Nevertheless, by forming the field plate 108 over the field plate dielectric layer 112 prior to forming the gate electrode 110 over the gate dielectric layer 116, device density of the overall LDMOS transistor is increased while reliability of the LDMOS transistor is maintained.

Figure 22:
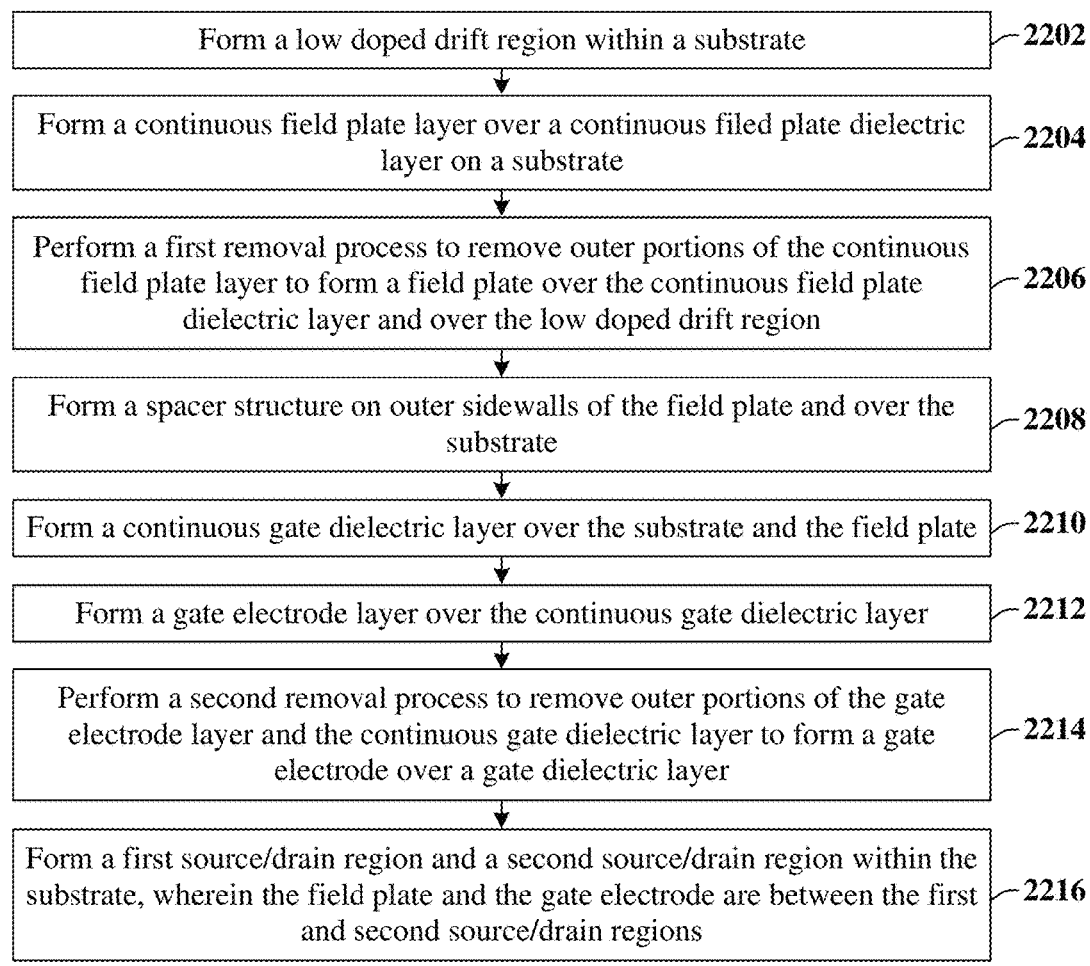
FIG. 22 illustrates a flow chart of some embodiments of a method of forming a high power device that corresponds to the method illustrated in FIGS. 5-21.

FIG. 22 illustrates a flow diagram of some embodiments of a method 2200 corresponding to the cross-sectional views 500-2100 of FIGS. 5-21, respectively.

While method 2200 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 2202, a low doped drift region is formed within a substrate. FIG. 5 illustrates a cross-sectional view 500 of some embodiments corresponding to act 2202.

At act 2204, a continuous field plate layer is formed over a continuous field plate dielectric layer on a substrate. FIG. 6 illustrates a cross-sectional view 600 of some embodiments corresponding to act 2204.

At act 2206, a first removal process is performed to remove outer portions of the continuous field plate player to form a field plate over the continuous field plate dielectric layer and over the low doped drift region. FIG. 8 illustrates a cross-sectional view 800 of some embodiments corresponding to act 2206.

At act 2208, a spacer structure is formed on outer sidewalls of the field plate and over the substrate. FIG. 10 illustrates a cross-sectional view 1000 of some embodiments corresponding to act 2208.

At act 2210, a continuous gate dielectric layer is formed over the substrate and the field plate. FIG. 12 illustrates a cross-sectional view 1200 of some embodiments corresponding to act 2210.

At act 2212, a gate electrode layer is formed over the continuous gate dielectric layer. FIG. 13 illustrates a cross-sectional view 1300 of some embodiments corresponding to act 2212.

At act 2214, a second removal process is performed to remove outer portions of the gate electrode layer and the continuous gate dielectric layer to form a gate electrode over a gate dielectric layer. FIG. 14 illustrates a cross-sectional view 1400 of some embodiments corresponding to act 2214.

At act 2216, a first source/drain region and a second source/drain region are formed within the substrate, wherein the field plate and the gate electrode are between the first and second source/drain regions. FIG. 18 illustrates a cross-sectional view 1800 of some embodiments corresponding to act 2216.

Therefore, the present disclosure relates to forming a high power device having a field plate arranged over a field plate dielectric layer that was formed prior to a gate electrode over a gate dielectric layer to reduce the spacing between the field plate and the gate electrode, thereby increasing device density of the overall high power device.

Accordingly, in some embodiments, the present disclosure relates to an integrated chip, comprising: a gate dielectric layer arranged over a substrate and between a source region and a drain region; a gate electrode arranged over the gate dielectric layer; a field plate dielectric layer arranged over the substrate and between the gate dielectric layer and the drain region; and a field plate arranged over the field plate dielectric layer, wherein the field plate dielectric layer is spaced apart from the gate dielectric layer.

In other embodiments, the present disclosure relates to an integrated chip comprising: a gate electrode arranged over a substrate between a first source/drain region and a second source/drain region; a field plate dielectric layer arranged over the substrate and between the gate electrode and the second source/drain region; a field plate arranged over a central portion of the field plate dielectric layer; and a spacer structure arranged over an outer portion of the field plate dielectric layer and surrounding outer sidewalls of the field plate.

In yet other embodiments, the present disclosure relates to a method of forming a high voltage transistor device, comprising: forming a source region separated from a drain region on or within a substrate; forming a continuous field plate dielectric layer over the substrate; forming a continuous field plate layer over the continuous field plate dielectric layer; performing a first removal process to remove outer portions of the continuous field plate layer to form a field plate and to remove outer portions of the continuous field plate dielectric layer; forming a spacer structure on outer sidewalls of the field plate and over the substrate; forming a continuous gate dielectric layer over the substrate and the field plate; forming a continuous gate electrode layer over the continuous gate dielectric layer; and performing a second removal process to remove outer portions of the continuous gate electrode layer and the continuous gate dielectric layer to form a gate electrode over a gate dielectric layer that is spaced apart from the field plate and the field plate dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a high voltage transistor device, comprising:
   forming a source region separated from a drain region on or within a substrate;
   forming a continuous field plate dielectric layer over the substrate;
   forming a continuous field plate layer over the continuous field plate dielectric layer;
   performing a first removal process to remove outer portions of the continuous field plate layer to form a field plate and to remove outer portions of the continuous field plate dielectric layer;
   forming a spacer structure on outer sidewalls of the field plate and over the substrate;
   forming a continuous gate dielectric layer over the substrate and the field plate;
   forming a continuous gate electrode layer over the continuous gate dielectric layer; and
   performing a second removal process to remove outer portions of the continuous gate electrode layer and the continuous gate dielectric layer to form a gate electrode over a gate dielectric layer that is spaced apart from the field plate and the continuous field plate dielectric layer.

2. The method of claim 1, further comprising:
   performing a third removal process after the formation of the spacer structure to further remove outer portions of the continuous field plate dielectric layer that are uncovered by the spacer structure or the field plate to form a field plate dielectric layer beneath the spacer structure and the field plate.

3. The method of claim 1, further comprising:
   performing a planarization process to remove upper portions of the field plate and/or the gate electrode, wherein after the planarization process, topmost surfaces of the field plate and the gate electrode are substantially coplanar.

4. The method of claim 1, further comprising:
   forming an interconnect structure over the field plate and the gate electrode comprising interconnect wires and interconnect vias within an interconnect dielectric layer, wherein the interconnect structure electrically couples the field plate to the source region.

5. The method of claim 1, wherein the first and second removal processes comprise dry etching.

6. The method of claim 1, wherein the spacer structure surrounds outer sidewalls of the field plate and is arranged directly over the continuous field plate dielectric layer.

7. The method of claim 6, wherein the spacer structure is arranged directly over an outer portion of the continuous field plate dielectric layer, wherein the field plate is arranged directly over a central portion of the continuous field plate dielectric layer, and wherein the central portion of the continuous field plate dielectric layer is thicker than the outer portion of the continuous field plate dielectric layer.

8. The method of claim 1, wherein the field plate has a topmost surface arranged at a first height above a topmost surface of the substrate, wherein the gate electrode has a topmost surface arranged at a second height above the topmost surface of the substrate, and wherein the first height is about equal to the second height.

9. The method of claim 1, wherein the field plate is electrically coupled to the source region.

10. The method of claim 1, wherein the field plate comprises a different material than the gate electrode.

11. The method of claim 1, wherein the field plate directly overlies a low doped drift region of the substrate, and wherein the low doped drift region has a lower doping concentration than the drain region.

12. The method of claim 1, wherein a central portion of the continuous field plate dielectric layer is thicker than an outer portion of the continuous field plate dielectric layer.

13. The method of claim 1, wherein the substrate comprises gallium nitride.

14. The method of claim 1, wherein the spacer structure has a topmost surface that is at a same height above a topmost surface of the substrate as the field plate.

15. The method of claim 1, wherein the gate dielectric layer is arranged directly between the gate electrode and the substrate, wherein the gate dielectric layer has a width equal to a width of the gate electrode.

16. The method of claim 15, wherein the gate dielectric layer has a first thickness, wherein an outer portion of the continuous field plate dielectric layer has a second thickness greater than the first thickness, and wherein a central portion of the continuous field plate dielectric layer has a third thickness greater than the second thickness.

17. The method of claim 1, wherein the gate electrode is thicker than the field plate.

18. The method of claim 1, wherein upper surfaces of the field plate and the gate electrode are substantially coplanar.

19. A method of forming a transistor device, comprising:
forming a drift region within a substrate;
forming a field plate dielectric layer over the substrate;
forming a field plate layer over the field plate dielectric layer;
performing a first removal process to remove outer portions of the field plate layer to form a field plate and to reduce a thickness of the outer portions of the field plate dielectric layer to form reduced thickness outer portions of the field plate dielectric layer;
forming a spacer structure on outer sidewalls of the field plate and on the reduced thickness outer portions of the field plate dielectric layer;
forming a gate dielectric layer over the substrate and the field plate;
forming a gate electrode layer over the gate dielectric layer; and
performing a second removal process to remove outer portions of the gate electrode layer and the gate dielectric layer to form a gate electrode over a gate dielectric that is spaced apart from the field plate and the field plate dielectric layer.

20. A method, comprising:
forming a drift region within a substrate;
forming a field plate dielectric layer over the substrate;
forming a field plate layer over the field plate dielectric layer;
performing a first removal process to remove outer portions of the field plate layer to form a field plate and to reduce a thickness of the outer portions of the field plate dielectric layer to form reduced thickness outer portions of the field plate dielectric layer;
forming a spacer structure on outer sidewalls of the field plate and on the reduced thickness outer portions of the field plate dielectric layer;
forming a gate dielectric layer over the substrate and the field plate;
forming a gate electrode layer over the gate dielectric layer;
performing a second removal process to remove outer portions of the gate electrode layer and the gate dielectric layer to form a gate electrode over a gate dielectric that is spaced apart from the field plate and the field plate dielectric layer;
forming a conformal layer that extends continuously between nearest neighboring sidewalls of the gate electrode and the field plate to cover the substrate between the nearest neighboring sidewalls of the gate electrode and the field plate; and
forming a source region and a drain region after the conformal layer has been formed.

* * * * *